US005971566A

United States Patent [19]

Tani et al.

[11] Patent Number: 5,971,566

[45] Date of Patent: Oct. 26, 1999

[54] PLASMA DISPLAY DEVICE AND ITS MANUFACTURING METHOD

[75] Inventors: Yutaka Tani, Sanda; Shigeo Hirano, Otsu, both of Japan

[73] Assignee: Matsushita Electric Industrial Co., Ltd., Osaka, Japan

[21] Appl. No.: 08/893,986

[22] Filed: Jul. 16, 1997

[30] Foreign Application Priority Data

| | | | |
|---|---|---|---|
| Jul. 23, 1996 | [JP] | Japan | 8-193204 |
| Dec. 16, 1996 | [JP] | Japan | 8-335334 |
| Dec. 24, 1996 | [JP] | Japan | 8-343173 |
| Mar. 14, 1997 | [JP] | Japan | 9-061076 |

[51] Int. Cl.[6] ........ F21V 29/00

[52] U.S. Cl. ........ 362/294; 313/46

[58] Field of Search ........ 313/46, 493, 573, 313/582, 634; 362/294, 373

[56] References Cited

U.S. PATENT DOCUMENTS

| | | | |
|---|---|---|---|
| 4,546,407 | 10/1985 | Benenati | 361/386 |
| 5,146,354 | 9/1992 | Plesinger | 359/49 |
| 5,831,374 | 11/1998 | Morita et al. | 313/46 |

FOREIGN PATENT DOCUMENTS

| | | |
|---|---|---|
| 04-022045 | 1/1992 | Japan . |
| 5-11183 | 2/1993 | Japan . |
| 05-121005 | 5/1993 | Japan . |
| 7-212689 | 8/1995 | Japan . |
| 09-097015 | 4/1997 | Japan . |

*Primary Examiner*—Stephen Husar

*Attorney, Agent, or Firm*—Wenderoth, Lind & Ponack, L.L.P.

[57] ABSTRACT

A plasma display device comprising a plasma display panel, a chassis member which is disposed substantially in parallel with the plasma display panel, and a thermally conductive medium which is interposed between the plasma display panel and the chassis member.

16 Claims, 16 Drawing Sheets

PLASMA DISPLAY DEVICE AND ITS MANUFACTURING METHOD

BACKGROUND OF THE INVENTION

The present invention generally relates to a plasma display panel (PDP) for displaying characters or images through utilization of gas discharge and more particularly, to a plasma display device which includes a means for efficiently dissipating heat produced by the plasma display panel, and its manufacturing method.

Recently, plasma display devices acting as flat, thin and light display units having large screens are used for information terminals such as portable computers and their applicable field is expanding due to their clear display and their wide angle of field of view. In a plasma display device, a plasma display panel is formed by front and rear glass plates bonded to each other, and gas for electrical discharge is contained in a minute gap between the glass plates. Ultraviolet rays produced by electrical discharge in the gas are irradiated to phosphor on the rear glass plate such that display of light emission from the phosphor is performed. Hence, the plasma display device as a whole reaches rather high temperature through repetition of electrical discharge in the gas.

In a plasma display device, as display luminance of a plasma display panel is raised further, more heat is produced by the plasma display panel, so that the temperature of the plasma display panel rises and thus, display performance of the plasma display panel deteriorates. To actuate the plasma display panel for a long time will result in, for example, a drop in reliability of a driver circuit for driving the plasma display panel and therefore, is not preferable for performance and properties of the plasma display panel. Meanwhile, if a state in which a large difference in temperature exists in a plane of the plasma display panel continues for a long time, glass forming the plasma display panel is distorted, thereby resulting in fracture of the glass.

Therefore, in order to lower the temperature of the plasma display panel in operation and lessen distortion of the glass leading to its fracture, difference in temperature in the plane of the plasma display panel should be reduced and performance and quality of the plasma display device should be upgraded. As one of such countermeasures in a known plasma display device, a pair of draft fans 92 are provided on a rear face of a plasma display panel 91 through spacers 93 as shown in FIG. 1 and blow wind to the plasma display panel 91 as shown by the arrow A in FIG. 2 so as to lower temperature of the plasma display panel 91.

In case the plasma display panel 91 is installed in parallel with a vertical plane, temperature is distributed in a plane of the plasma display panel 91 as shown in FIG. 3 by natural convection of heat and thus, temperature difference between a high-temperature portion and a low-temperature portion reaches 10 plus several °C. Meanwhile, temperature difference in the plane of the plasma display panel 91 increases according to a pattern of an image displayed on the plasma display panel 91. For example, if a state in which a small bright image (bright display) is present in a dark background (dark display) as shown in FIG. 4 continues for a long time, temperature difference between the bright image and the dark background increases considerably, so that glass forming the plasma display panel 91 is distorted, thus resulting in fracture of the plasma display panel 91. Especially, if temperature difference in the plane of the plasma display panel 91 reaches 20° C. or more, there is a great risk of fracture of the plasma display panel 91.

In the conventional plasma display device provided with the draft fans 92, temperature of the plasma display panel 91 can be lowered but such a problem arises that it is difficult to reduce temperature difference in the plane of the plasma display panel 91. Furthermore, the prior art plasma display device has such drawbacks that noise of motors for the draft fans 92 is annoying, electric power is required to be supplied for driving the motors for the draft fans 92, the plasma display device as a whole becomes large due to the need for providing space for mounting the motors for the draft fans 92 and dust sucked together with external air into a casing of the plasma display device by the draft fans 92 stains the interior of the casing.

Meanwhile, in a known plasma display device, in order to lower the temperature of a plasma display panel in operation and upgrade performance and quality of the plasma display device as a whole, it is effective to attach a chassis member to a rear face of the plasma display panel. In this case, it is important that the plasma display panel and the chassis member are brought into close contact with each other.

SUMMARY OF THE INVENTION

Accordingly, an essential object of the present invention is to provide, with a view to eliminating the above mentioned disadvantages of prior art, a plasma display device in which even when luminance of a plasma display panel is raised, the temperature of the plasma display panel is kept low and high display quality is secured by lessening temperature difference in a plane of the plasma display panel.

In order to accomplish this object of the present invention, a plasma display device according to the present invention comprises: a plasma display panel; a chassis member which is disposed substantially in parallel with the plasma display panel; and a thermally conductive medium which is interposed between the plasma display panel and the chassis member.

It is preferable that the thermally conductive medium is provided so as to be brought into substantially close contact with the plasma display panel and the chassis member.

It is also preferable that the thermally conductive medium has a two-layer construction having first and second mediums brought into substantially close contact with the plasma display panel and the chassis member, respectively, such that not only does the first medium have a coefficient of thermal conductivity higher than that of the second medium but the second medium also function as a cushioning medium.

By the above described arrangements of the plasma display device of the present invention, since heat in a plane of the plasma display panel in operation is conducted to the chassis member through the thermally conductive medium so as to be dissipated into the air, temperature in the plane of the plasma display panel can be lowered and temperature difference in the plane of the plasma display panel can be lessened.

Furthermore, close contact of the thermally conductive medium with the plasma display panel and the chassis member can be enhanced by eliminating warpage of the plasma display panel and the chassis member and impact applied to the plasma display device from outside can be mitigated by the second medium functioning also as the cushioning medium.

BRIEF DESCRIPTION OF THE DRAWINGS

This object and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 5:
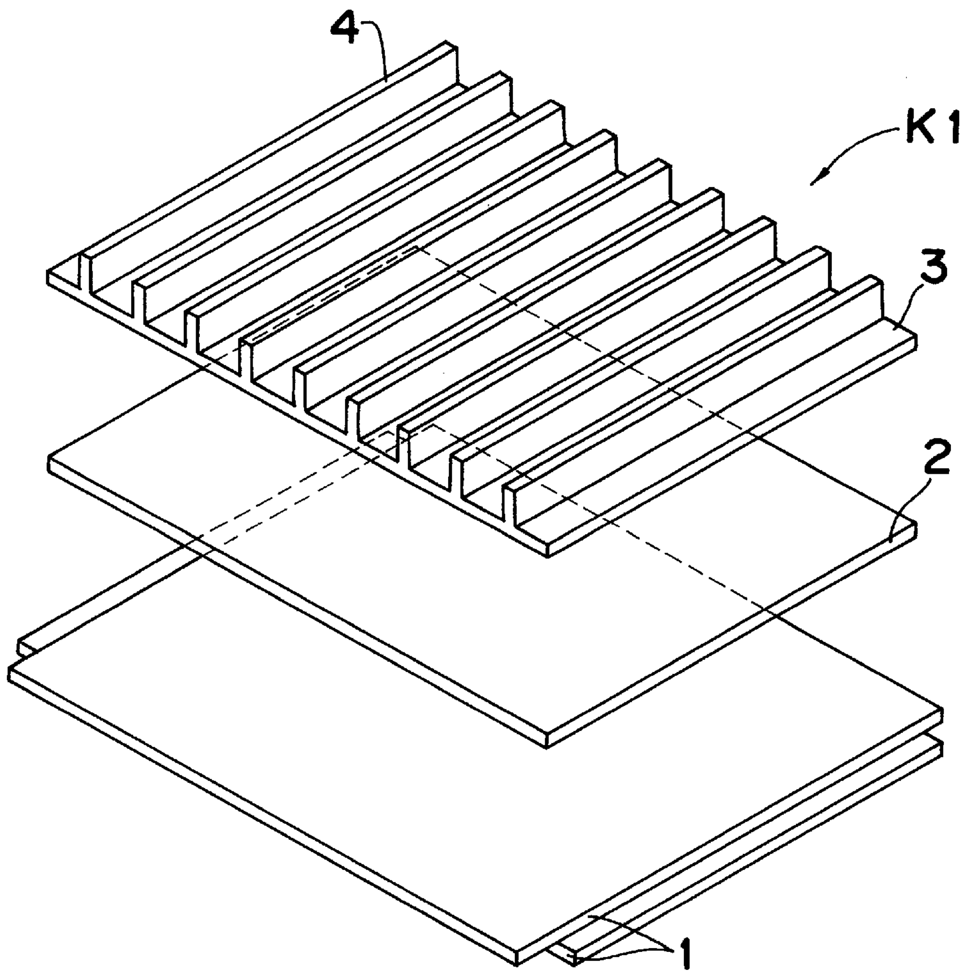
FIG. 5 is an exploded perspective view of a plasma display device according to a first embodiment of the present invention.
Figure 6:
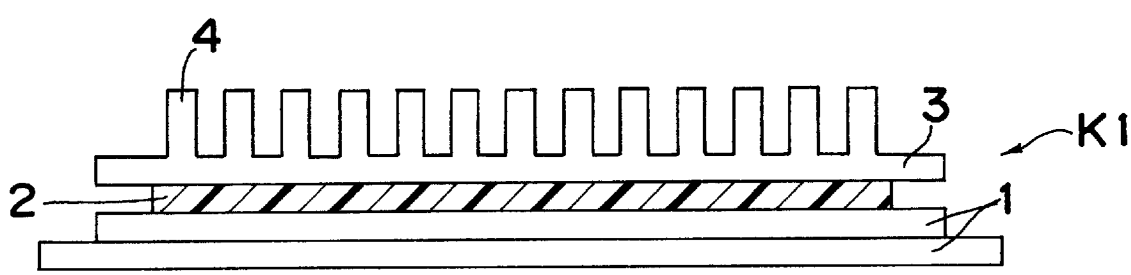
FIG. 6 is a sectional view of the plasma display device of FIG. 5.

Referring now to the drawings, FIGS. 5 and 6 show a plasma display device K1 according to a first embodiment of the present invention. The plasma display device K1 includes a plasma display panel 1, a thermally conductive medium 2 and a chassis member 3 acting as a heat dissipating member. Projections 4 for effecting heat dissipation efficiently are provided on the chassis member 3. The thermally conductive medium 2 is adapted to not only lessen temperature difference in a plane of the plasma display panel 1 but lower the temperature of the plasma display panel 1 by transferring heat of the plasma display panel 1 to the chassis member 3 efficiently and dissipating heat from the chassis member 3 into the air. Meanwhile, if the thermally conductive medium 2 is made of soft material in a gel state, the thermally conductive medium 2 acts also as a cushioning medium so as to protect the plasma display panel 1 from external impact.

In this embodiment, a 26-inch type plasma display panel is used as the plasma display panel 1. The thermally conductive medium 2 having a thickness of 1 to 5 mm and formed by a silicone sheet in a gel state and the chassis member 3 made of aluminum are sequentially attached to a whole rear face of the plasma display panel 1. When white display was performed on a whole face of the plasma display panel 1 by an electric power of 120 W, the temperature of the plasma display panel 1 dropped about 25° C. in comparison with a case in which both the thermally conductive medium 2 and the chassis member 3 are not attached to the plasma display panel 1. The thermally conductive medium 2 may be formed by a rubber sheet in place of the silicone sheet.

Figure 7:
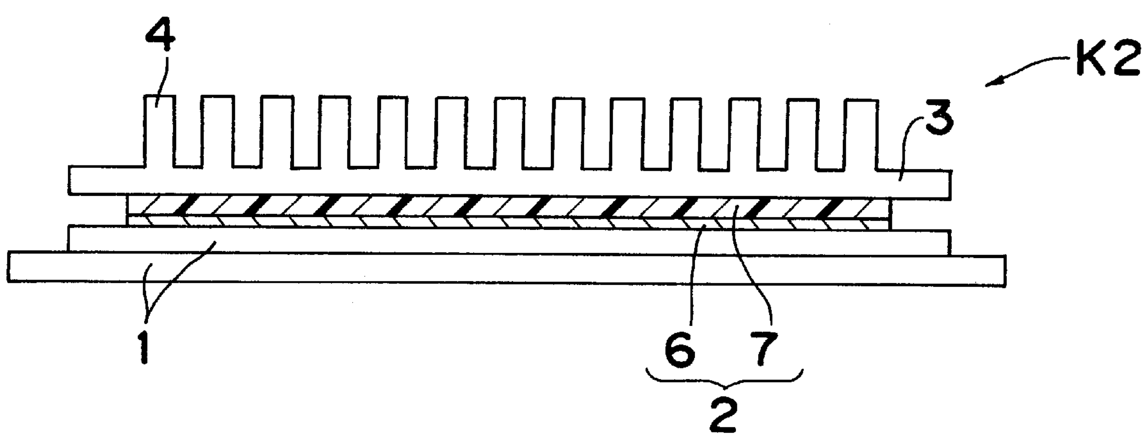
FIG. 7 is a sectional view of a plasma display device according to a second embodiment of the present invention.

Meanwhile, since the plasma display panel 1 and the chassis member 3 have slight warpage, it is preferable that the thermally conductive medium 2 has higher flexibility so as to bring the thermally conductive medium 2 into close contact with the plasma display panel 1 and the chassis member 3 such that not only is heat conduction from the plasma display panel 1 to the chassis member 3 improved but the plasma display panel 1 is protected from external impact by the thermally conductive medium. In order to effectively reduce temperature difference in the plane of the plasma display panel 1 and lower the temperature of the plasma display panel 1, the thermally conductive medium 2 has a higher coefficient of thermal conductivity preferably. However, if material having a high coefficient of thermal conductivity is used for making the thermally conductive medium 2, content of metal in the material is high and thus, elasticity and flexibility of the thermally conductive medium 2 drop. Thus, in FIG. 7 showing a plasma display device K2 according to a second embodiment of the present invention, the thermally conductive medium 2 has a two-layer construction including first and second mediums 6 and 7. The first medium 6 is formed by a metal sheet or a carbon sheet having a high coefficient of thermal conductivity, while the second medium 7 is formed by a flexible silicone sheet in a gel state or the like having a standard coefficient of thermal conductivity. Flexibility is imparted to the first medium 6 by reducing the thickness of the first medium 6 to 0.1 to 0.5 mm. Temperature difference in the plane of the plasma display panel 1, which is caused by heat produced in the plasma display panel 1, is lessened by the first medium 6. Heat transferred to the first medium 6 is transferred to the chassis member 3 by the second medium 7 efficiently and then, is dissipated from the chassis member 3 into the air. Meanwhile, since the thermally conductive medium 2 has elasticity, vibrations and impact applied from outside to the plasma display panel 1 are mitigated by the thermally conductive medium 2, so that fracture of the plasma display panel 1 is prevented effectively and close contact of the thermally conductive medium 2 with the plasma display panel 1 and the chassis member 3 is enhanced and heat conduction from the plasma display panel 1 to the chassis member 3 is performed efficiently.

Figure 1:
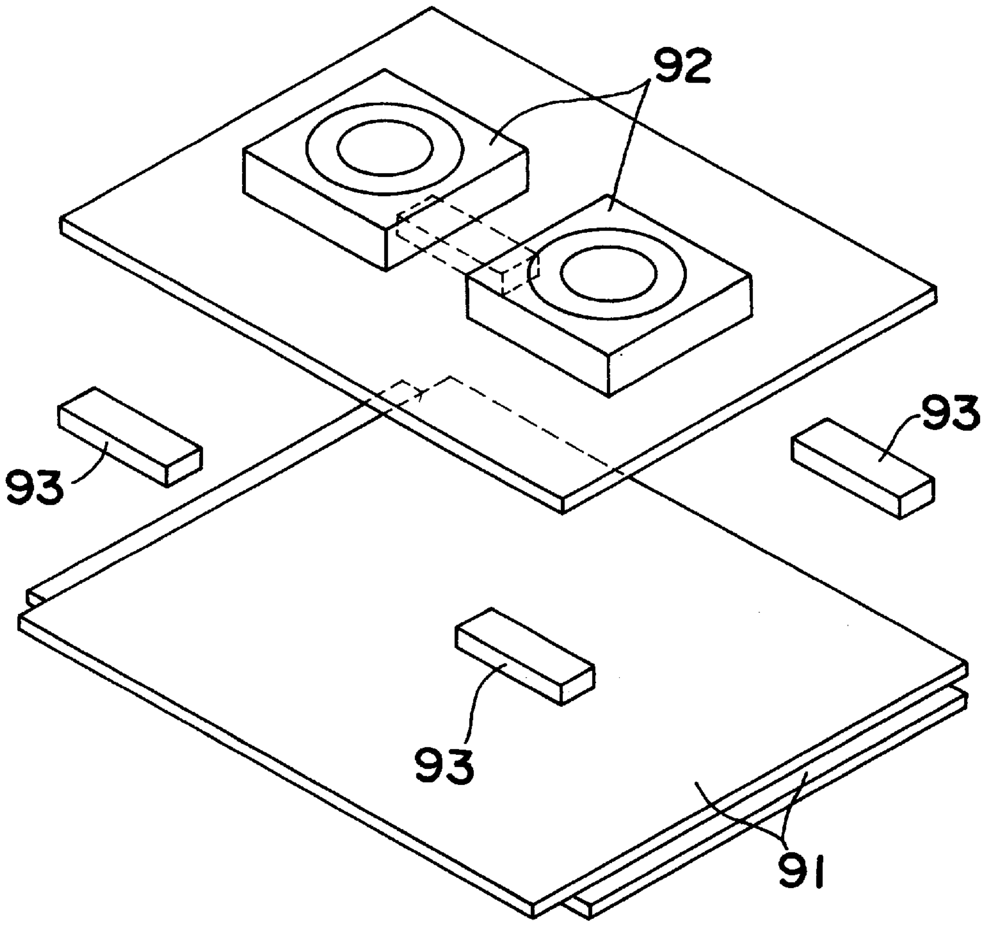
FIG. 1 is an exploded perspective view of a prior art plasma display device (already referred to)
Figure 2:
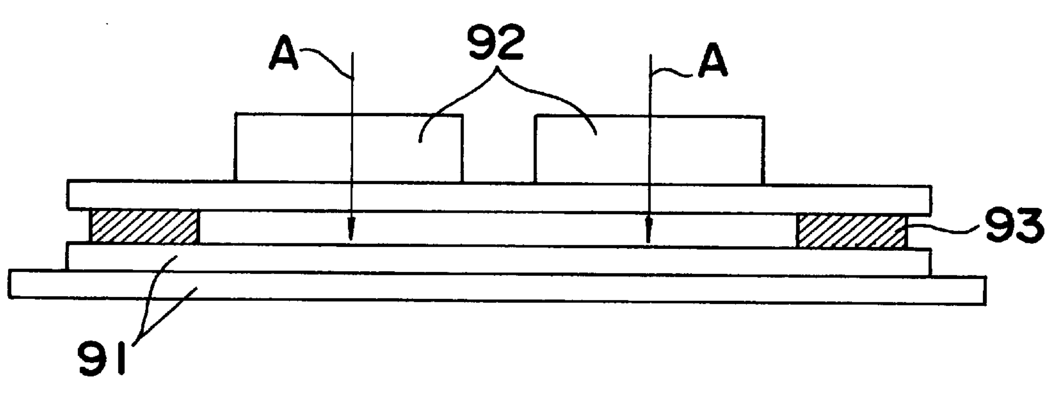
FIG. 2 is a sectional view of the prior art plasma display device of FIG. 1 (already referred to)
Figure 3:
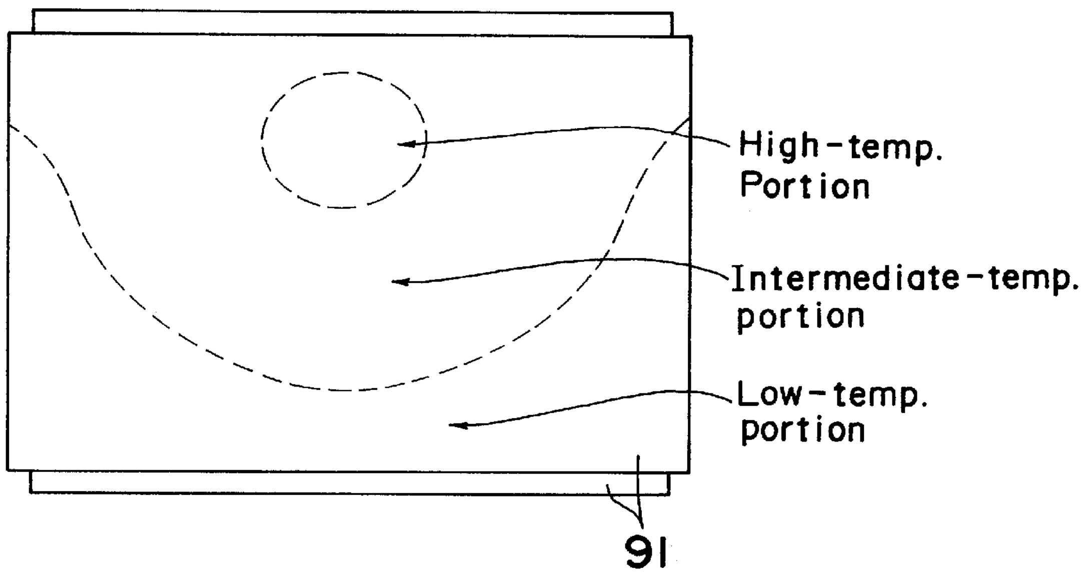
FIG. 3 is a schematic view showing temperature distribution in a plane of a plasma display panel of the prior art plasma display device of FIG. 1 (already referred to)
Figure 4:
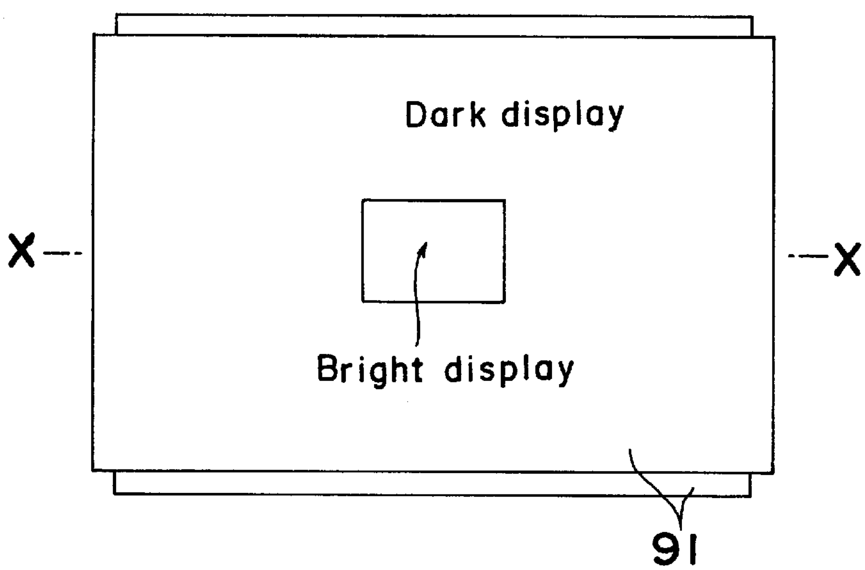
FIG. 4 is a schematic view showing a pattern of display in the plasma display panel (already referred to)
Figure 8:
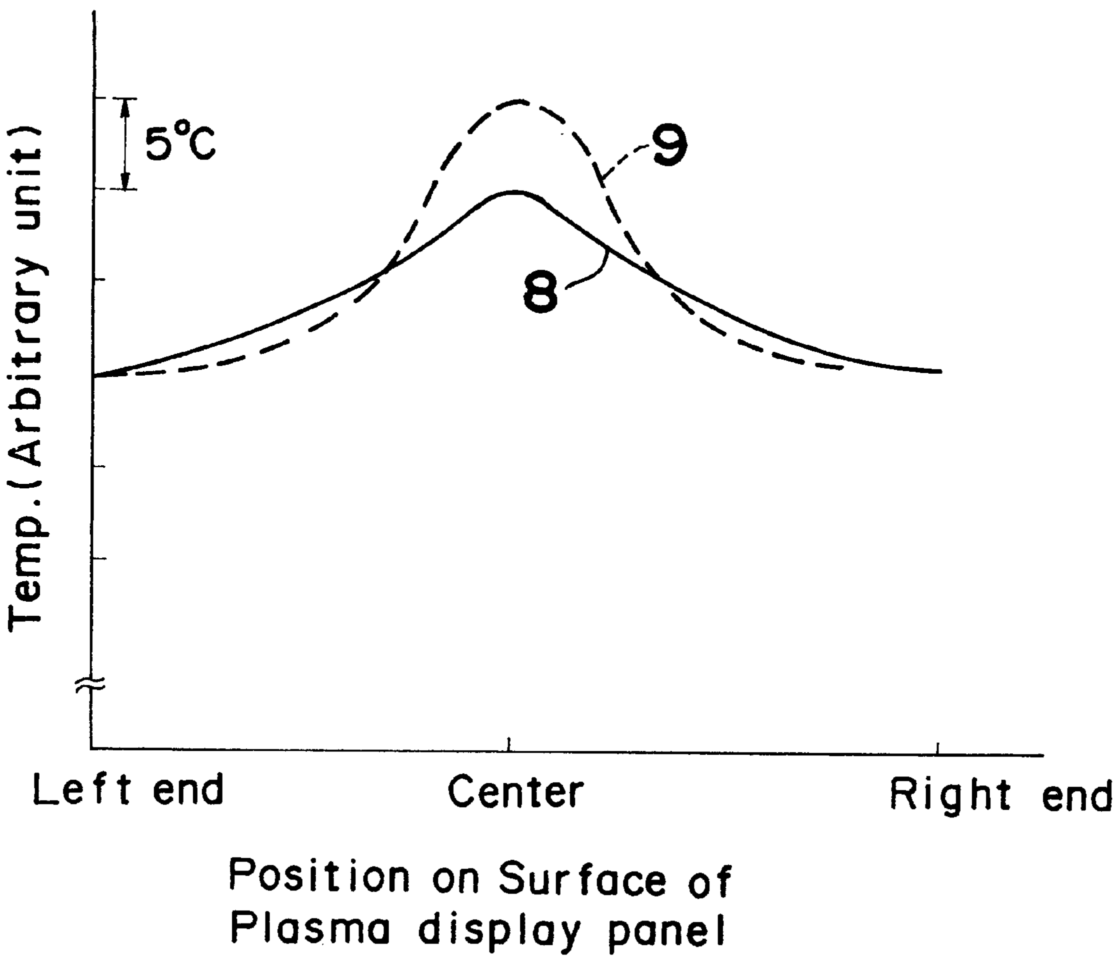
FIG. 8 is a graph showing characteristics of temperature distribution in plasma display panels of the plasma display devices of FIGS. 5 and 7.

In the plasma display device K2, a carbon sheet having a coefficient of thermal conductivity of 800 to 1000 W/m°C. and a thickness of 0.1 to 0.5 mm is employed as the first medium 6, while a silicone sheet in a gel state, which has a coefficient of thermal conductivity of 1 to 5 W/m°C. and a thickness of 1 to 5 mm, is employed as the second medium 7. By using this thermally conductive medium 2, a bright image is displayed at a central portion of the plasma display panel 1 against dark background as shown in FIG. 4. At this time, the solid line 8 in FIG. 8 shows characteristics of temperature distribution along the line X—X (FIG. 4) of the plasma display panel 1 of the plasma display device K2. On the other hand, the broken line 9 in FIG. 8 shows characteristics of temperature distribution along the line X—X of the plasma display panel 1 of the plasma display device K1. Heat in the plane of the plasma display panel 1 in the characteristics of the solid line 8 for the plasma display device K2 is diffused more sufficiently from the central portion of the plasma display panel 1 towards opposite end portions of the plasma display panel 1 than that in the characteristics of the broken line 9 for the plasma display device K1. As a result, temperature difference in the plane of the plasma display panel 1 of the plasma display device K2 is reduced conspicuously in comparison with that of the plasma display device K1. This is because the carbon sheet acting as the first medium 6 has the coefficient of thermal conductivity of 800 to 1000 W/m°C. in a direction of its face. Although the coefficient of thermal conductivity of the carbon sheet acting as the first medium 6 is lower in the direction of its thickness than in the direction of its face, heat is efficiently transferred in the direction of the thickness from the plasma display panel 1 to the chassis member 3 by making the carbon sheet thin as described above.

In the plasma display devices K2 and K1, since temperature difference in the plane of the plasma display panel 1 is less than 20° C. as is apparent from the lines 8 and 9 of FIG. 8, fracture of the plasma display panel 1 can be prevented.

The first medium 6 may be formed by a copper foil, an aluminum foil or the like in place of the carbon sheet, while the second medium 7 may be formed by a rubber sheet in place of the silicone sheet.

As is clear from the foregoing description of the first and second embodiments of the present invention, since the thermally conductive medium is provided between the plasma display panel and the chassis member, not only is the temperature of the plasma display panel in operation lowered but temperature difference in the plane of the plasma display panel is lessened, so that a highly reliable plasma display device can be obtained. Furthermore, since the hitherto required draft fans are not employed, noise of motors of the draft fans is eliminated and electric power for driving the motors of the draft fans and space for mounting the motors of the draft fans are not necessary.

Figure 9:
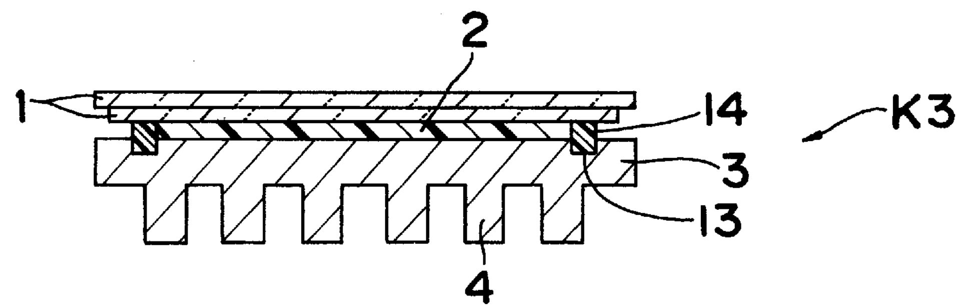
FIG. 9 is a sectional view of a plasma display device according to a third embodiment of the present invention.

FIG. 9 shows a plasma display device K3 according to a third embodiment of the present invention. In the plasma display device K3, a groove 13 is formed at a rectangular peripheral edge of the chassis member 3 and a cushioning medium 14 is fitted into the groove 13. The thermally conductive medium 2 is provided in a region enclosed by the cushioning medium 14 such that the cushioning medium 14 is brought into substantially close contact with the thermally conductive medium 2.

Figure 10:
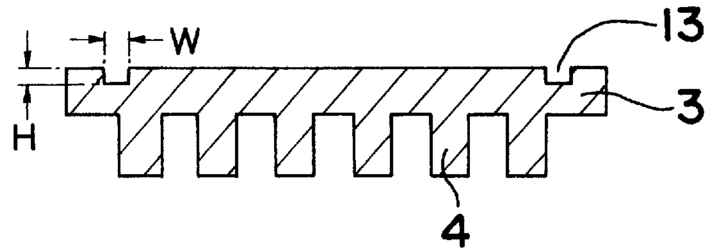
FIG. 10 is a sectional view of a chassis member of the plasma display device of FIG. 9.
Figure 11:
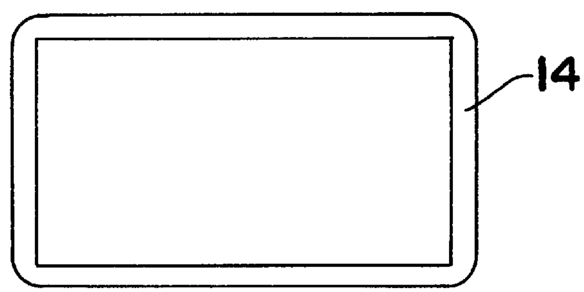
FIG. 11 is a top plan view of a heat-resistant cushioning medium of the plasma display device of FIG. 9.
Figure 12:
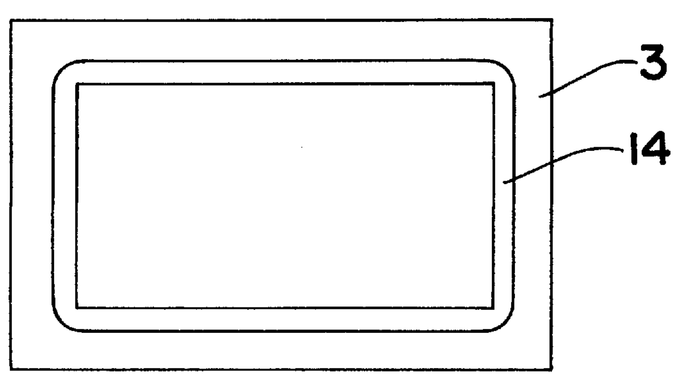
FIG. 12 is a top plan view of the chassis member of FIG. 10 provided with the cushioning medium of FIG. 11.
Figure 13:
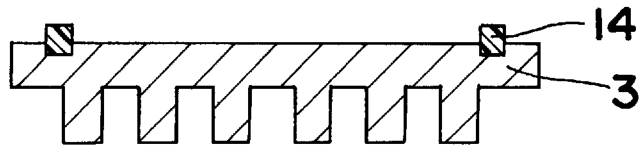
FIG. 13 is a sectional view of the chassis member and the cushioning medium of FIG. 12.

Hereinafter, a manufacturing method of the plasma display device K3 is described. As shown in FIG. 10, the groove 13 is formed at the rectangular peripheral edge of the chassis member 3 and has, for example, a width W of 5.5 mm and a depth H of 2 mm. The cushioning medium 14 having a rectangularly annular shape as shown in FIG. 11 is fitted into this groove 13 such that a predetermined region is enclosed by the cushioning medium 14 as shown in FIGS. 12 and 13. For example, the cushioning medium 14 has a width of 5 mm and a height of 4 mm.

Figure 14:
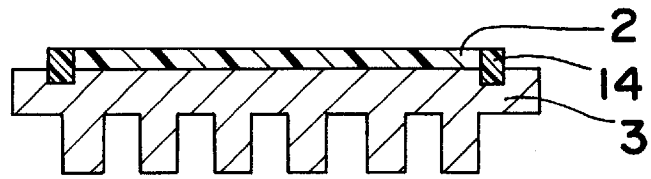
FIG. 14 is a sectional view showing curing of liquid of a thermally conductive medium of the plasma display device of FIG. 9.

Subsequently, as shown in FIG. 14, paste of silicone resin is injected as the thermally conductive medium 2 into the region surrounded by the cushioning medium 14 and then, is cured. At this time, by setting atmosphere at a temperature of, for example, 120° C., the paste of silicone resin is cured in about 20 min. so as to be turned into the solid thermally conductive medium 2. In this case, the cushioning medium 14 should have heat resistance. The paste of silicone resin can be dried at ordinary temperature but a long period is required for curing the paste of silicone resin at ordinary temperature.

The solid thermally conductive medium 2 obtained by curing the liquid silicone resin as described above has a thickness of 2 mm. By attaching the plasma display panel 1 to the thermally conductive medium 2, the plasma display device K3 is obtained.

The cushioning medium 14 may be formed by a silicone tape. In this case, after the liquid thermally conductive medium has been cured, the tape may be removed from the chassis member 3 or may be left as it is without being removed from the chassis member 3. Furthermore, in this case, the groove 13 is not required to be formed on the chassis member 3.

Meanwhile, in place of the cushioning member 14, a recess for receiving the thermally conductive medium 2 may be formed on one face of the chassis member 3, to which the thermally conductive medium 2 is attached or a frame for blocking outflow of the liquid thermally conductive medium may be merely provided on the face of the chassis member 3.

In the above described manufacturing method of the plasma display device K3, since bubbles do not penetrate in between the thermally conductive medium 2 and the chassis member 3, the plasma display device K3 having excellent heat conductivity and heat dissipation property can be obtained.

Figure 15:
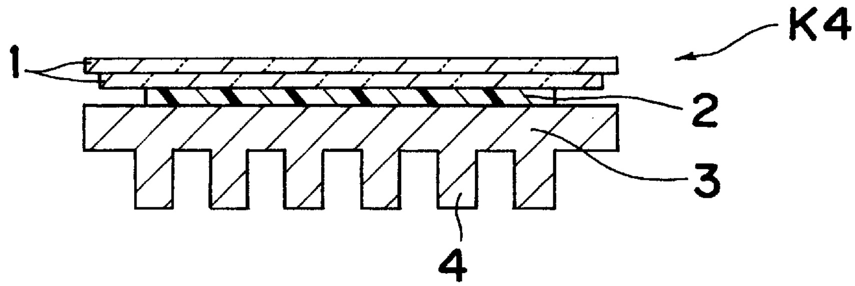
FIG. 15 is a sectional view of a plasma display device according to a fourth embodiment of the present invention.

FIG. 15 shows a plasma display device K4 according to a fourth embodiment of the present invention. It should be noted that the plasma display device K4 is identical with the plasma display device K1. In the plasma display device K4, the thermally conductive medium 2 is provided on the chassis member 3 and the plasma display panel 1 is provided so as to be brought into substantially close contact with the thermally conductive medium 2.

Figure 16:
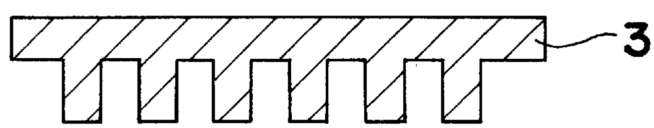
FIG. 16 is a sectional view of a chassis member of the plasma display device of FIG. 15.
Figure 17:
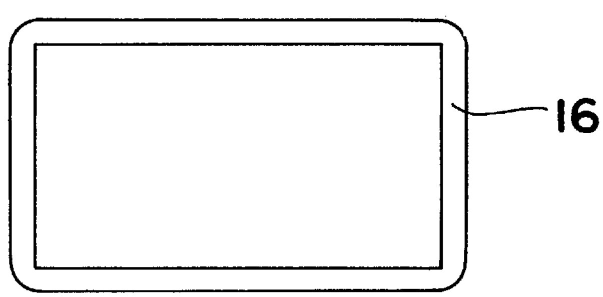
FIG. 17 is a top plan view of a mold employed for manufacture of the plasma display device of FIG. 15.
Figure 18:
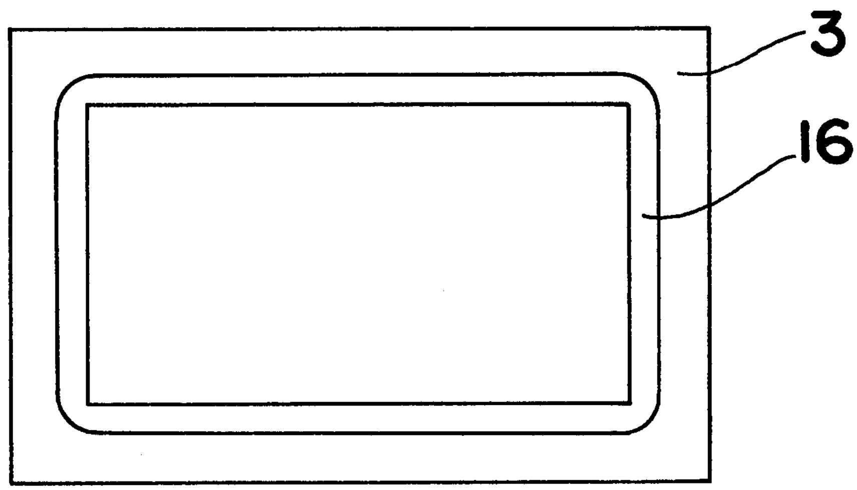
FIG. 18 is a top plan view of the chassis member of FIG. 16 provided with the mold of FIG. 17.
Figure 19:
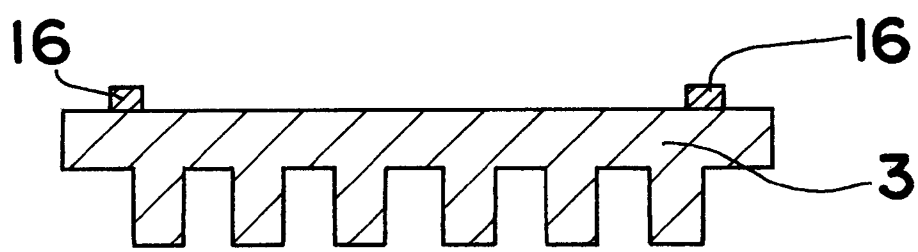
FIG. 19 is a sectional view of the chassis member and the mold of FIG. 18.
Figure 20:
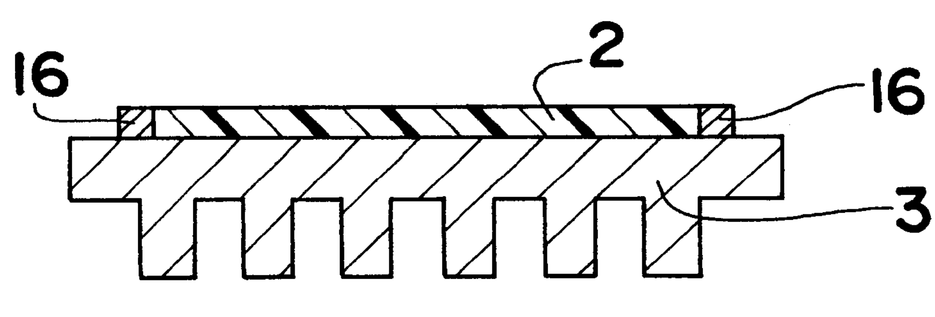
FIG. 20 is a sectional view showing curing of liquid of a thermally conductive medium of the plasma display device of FIG. 15.

Hereinafter, a manufacturing method of the plasma display device K4 is described. A rectangularly annular frame mold 16 shown in FIG. 17 is secured to the chassis member 3 shown in FIG. 16 such that a region enclosed by the frame mold 16 is defined as shown in FIGS. 18 and 19. For example, the frame mold 16 has a width of 5 mm and a height of 2 mm. Subsequently, as shown in FIG. 20, paste of the thermally conductive medium 2 is injected into the region enclosed by the frame mold 16 and then, is cured so as to obtain the solid thermally conductive medium 2. At this time, the thermally conductive medium 2 has a thickness of 1 to 5 mm, preferably, about 2 mm. Thereafter, the frame mold 16 is removed from the chassis member 3 and the plasma display panel 1 is attached to the thermally conductive medium 2. As a result, the plasma display device K4 is obtained.

In the manufacturing method of the plasma display device K4, since bubbles do not penetrate in between the thermally conductive medium 2 and the chassis member 3, the plasma display device K4 having excellent thermal conductivity and heat dissipation property can be obtained.

Meanwhile, in the above described third and fourth embodiments of the present invention, the thermally conductive medium 2 may be made of soft material in a gel state, so that the thermally conductive medium 2 acts also as a cushioning medium so as to protect the plasma display panel 1 from external impact.

As is clear from the foregoing description of the third and fourth embodiments of the present invention, since the thermally conductive medium is provided between the plasma display panel and the chassis member, temperature of the plasma display panel in operation is lowered and thus, the highly reliable plasma display device can be obtained. Furthermore, in the manufacturing methods of the plasma display devices according to the third and fourth embodiments of the present invention, it is possible to obtain the plasma display device having excellent heat conductivity and heat dissipation property, in which close contact of the thermally conductive medium with the plasma display panel and the chassis member is enhanced.

Figure 21:
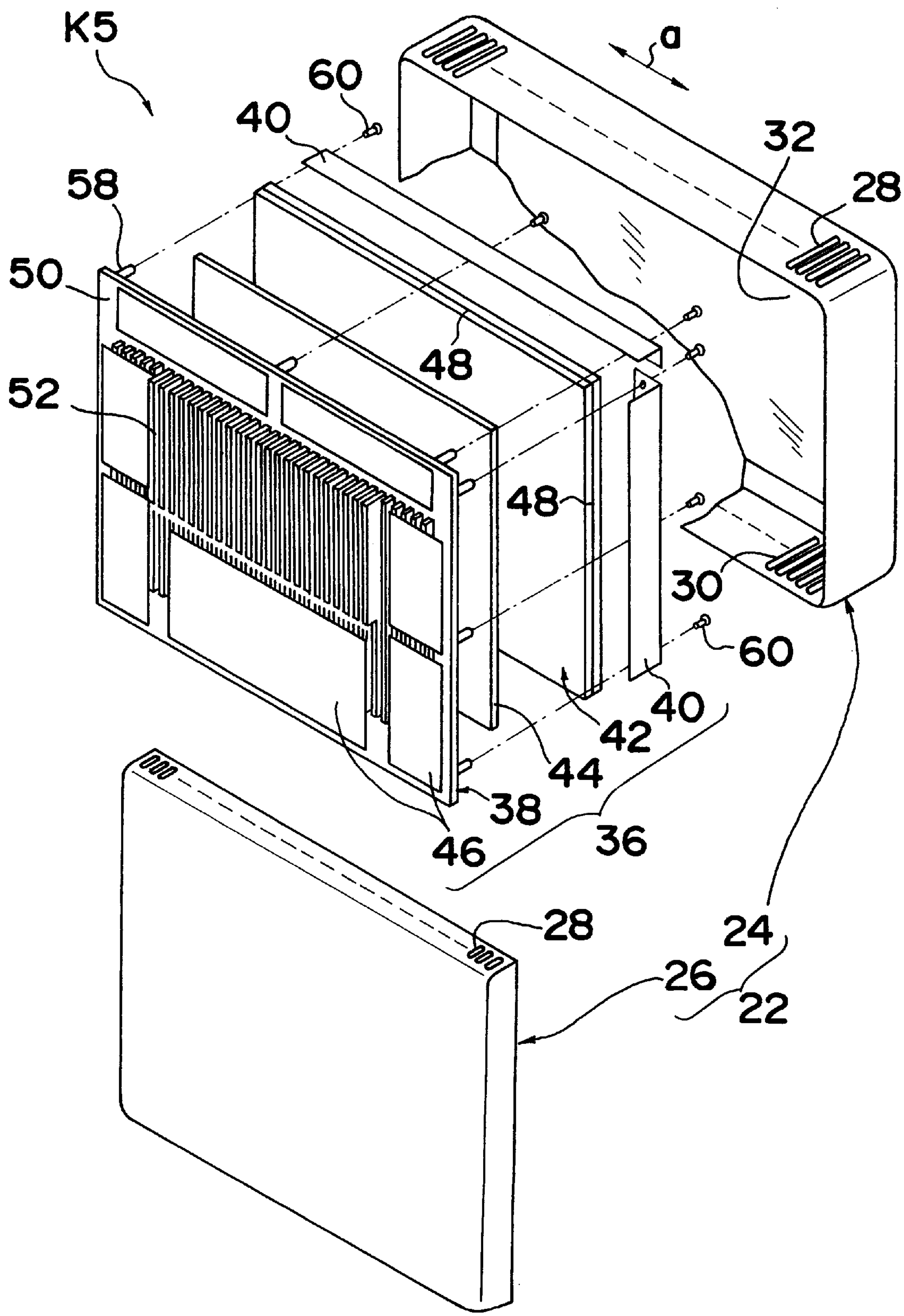
FIG. 21 is an exploded perspective view of a plasma display device according to a fifth embodiment of the present invention.

FIG. 21 shows a plasma display device K5 according to a fifth embodiment of the present invention. The plasma display device K5 includes a casing 22 and an internal unit 36 accommodated in the casing 22. The casing 22 is formed by assembling a front casing 24 and a rear casing 26 with each other. A plurality of vent holes 28 and 30 are formed in a lateral direction of the arrow a at upper and lower portions of the front casing 24, respectively and a light transmitting portion 32 made of glass or the like is provided on a front face of the front casing 24. Likewise, a plurality of the vent holes 28 and 30 are formed in the lateral direction at upper and lower portions of the rear casing 26, respectively.

The internal unit 36 includes a chassis member 38, a plasma display panel 42 mounted on a front face 56 of the chassis member 38 by L-shaped angle plates 40, a thermally conductive medium 44 formed by a silicone sheet or the like and interposed between the chassis member 38 and the plasma display panel 42 and a plurality of circuit boards 46 supported on a rear face 50 of the chassis member 38. The thermally conductive medium 44 is provided for efficiently transferring heat of the plasma display panel 42 to the chassis member 38. Meanwhile, the circuit boards 46 are provided for driving and controlling light emission of the plasma display panel 42.

The plasma display panel 42 is constituted by a front panel and a rear panel. As will be seen from FIG. 5, the front panel has a lateral side longer than that of the rear panel and a vertical side shorter than that of the rear panel and thus, the front and rear panels have portions in which the front and rear panels do not overlap each other. Although not specifically shown, terminals connected to electrodes in the plasma display panel 42 are formed at these nonoverlapping portions of the front and rear panels. A plurality of filmy wires (not shown) each having a female connector at its distal end are contact bonded to the terminals. The female connectors are, respectively, connected to male connectors (not shown) provided at an edge of each of the circuit boards 46. Consequently, each of the circuit boards 46 is electrically connected to the plasma display panel 42.

Figure 22:
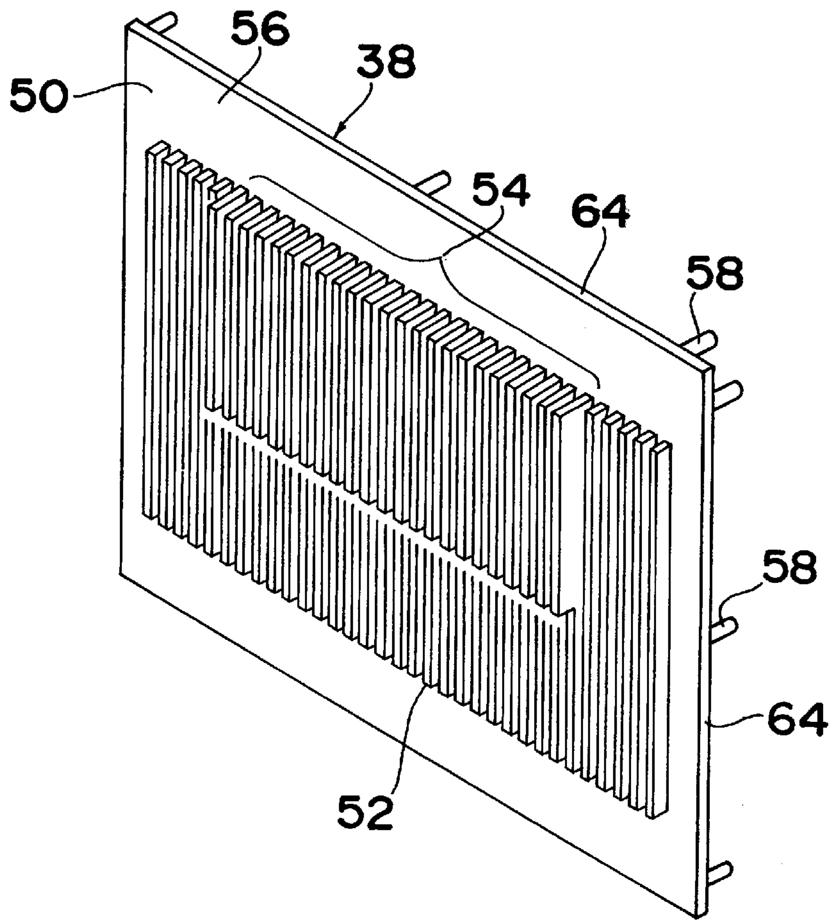
FIG. 22 is a perspective view of a chassis member of the plasma display device of FIG. 21.

The chassis member 38 is obtained by die casting of aluminum. As shown in FIG. 22, a plurality of fins 52 for heat dissipation are molded integrally with the chassis member 38 over substantially the whole area of the rear face 50 of the chassis member 38. The fins 52 each having a rectangular shape project from the rear face 50 of the chassis member 38 and extend vertically in parallel with each other so as to be laterally spaced a predetermined interval from each other. Experiments conducted by the inventors of this application revealed that when each of the fins 52 has a width of about 3 mm and a gap between the fins 52 is set at about 3 mm, namely, the fins 52 are arranged at an interval of about 6 mm, heat dissipation efficiency of the fins 52 is excellent. However, it is needless to say that the fins 52 are not restricted to these dimensions. In addition, the fins 52 are not restricted to the above mentioned shape but may also be vertically divided into a plurality of sections.

As shown in FIG. 22, the fins 52 at an upper central region 54 of the rear face 50 of the chassis member 38 are projected further from the rear face 50 than the fins 52 at the remaining region of the rear face 50 of the chassis member 38 for the following reason. Namely, the temperature of the chassis member 38 is raised by heat transferred from the plasma display panel 42 to the chassis member 38 via the thermally conductive medium 44. However, temperature distribution of the chassis member 38 is not uniform and the temperature of an upper portion of the chassis member 38 is higher than that of the remaining portion of the chassis member 38. Therefore, on the basis of this finding, heat dissipation efficiency of the upper central region 54 of the rear face 50 of the chassis member 38 is made larger than that of the remaining region of the rear face 50 of the chassis member 38.

As shown in FIG. 21, the circuit boards 46 are disposed around the upper central region 54 of the rear face 50 of the chassis member 38. Hence, since the upper central region 54 of the rear face 50 of the chassis member 38 is not covered by the circuit boards 46, high heat dissipation efficiency of the fins 52 at the upper central region 54 of the rear face 50 of the chassis member 38 is not hampered by the circuit boards 46. Meanwhile, the circuit boards 46 are supported by studs (not shown) projecting from the rear face 50 of the chassis member 38 and are spaced away from a distal end of each of the fins 52 and the rear face 50 of the chassis member 38 so as not to be brought directly into contact with the fins 52 and the rear face 50 of the chassis member 38 as shown in FIG. 23.

On the other hand, a plurality of bosses 58 each having a threaded hole project integrally from a peripheral edge of the front face 56 of the chassis member 38. Since the bosses 58 are molded integrally with the chassis member 38 preliminarily, the number of operational steps and cost can be reduced in comparison with a case in which the bosses 58 are later mounted on the chassis member 38 by welding, crimping, etc.

Figure 23:
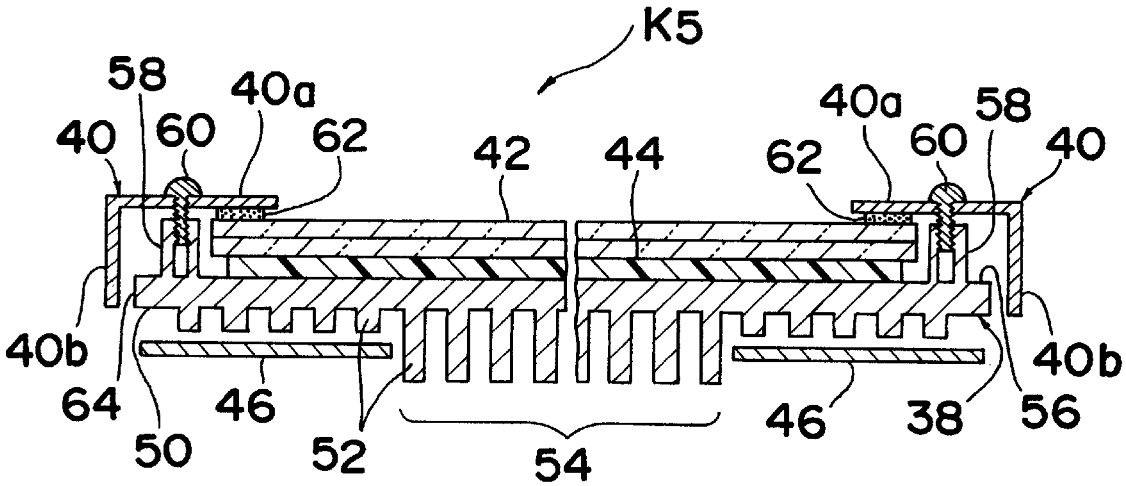
FIG. 23 is a fragmentary sectional view of the plasma display device of FIG. 21.

The angle plates 40 are provided for four sides of the rectangular plasma display panel 42, respectively so as to clamp the plasma display panel 42 and the thermally conductive medium 44 to the chassis member 38 by screwing bolts 60 into the threaded holes of the bosses 58 through bolt holes of the angle plates 40 as shown in FIGS. 21 and 23. Each of the angle plates 40 is formed by plate portions 40*a* and 40*b* intersecting with each other substantially orthogonally. The plate portion 40*a* is brought into pressing contact with a peripheral edge of a front face of the plasma display panel 42 through a cushioning member 62 made of foamed material such that the plasma display panel 42 is secured to the front face 56 of the chassis member 38 via the thermally conductive medium 44.

Meanwhile, the plate portion 40*b* of the angle plate 40 extends along each of four outer peripheral surfaces 64. A number of the above mentioned filmy wires (not shown) for electrically connecting the circuit boards 46 and the plasma display panel 42 are present between the plate portions 40*b* and the outer peripheral surfaces 64 of the chassis member 38. Therefore, when an operator mounts the assembled internal unit 36 in the rear casing 26 by gripping an edge of the assembled internal unit 36, the plate portions 40*b* serve to protect the filmy wires so as to prevent damage to the filmy wires.

In the plasma display device K5 of the above described arrangement, when display is performed by light emission of the plasma display panel 42, the temperature of the plasma display panel 42 is raised by heat produced by electrical discharge in the plasma display panel 42. Heat produced in the plasma display panel 42 is transferred to the chassis member 38 through the thermally conductive medium 44 and is efficiently dissipated from the fins 52 molded integrally with the chassis member 38. Air heated in the casing 22 by this heat dissipation is discharged outwardly from the vent holes 28 of the upper portion of the casing 22, while air at room temperature flows into the casing 22 from the vent holes 30 of the lower portion of the casing 22. The plasma display panel 42 and the circuit boards 46 are cooled by this natural convection. On the supposition that a maximum room temperature is 40° C., it was found by experiments conducted by the inventors of this application that the temperature in the casing 22 can be maintained at not more than a permissible highest temperature which is equal to a sum of 40° C. and room temperature.

Since the fins 52 are molded integrally with the chassis member 38 for supporting the plasma display panel 42 such that the chassis member 38 acts also as a heat dissipating member as described above, it is possible to obtain an unforced cooling construction in which air in the casing 22 is subjected to natural convection so as to cool the interior of the casing 22. Therefore, since exhaust fans for forcibly discharging air in the casing 22 outwardly so as to forcibly cool the interior of the casing 22 are not required, such problems as noise and failure of the exhaust fans and suction of dust due to forced exhaust can be eliminated and production cost can be reduced.

Meanwhile, in the plasma display device K5, the unforced cooling construction in which the exhaust fans are eliminated is employed as described above. However, in the plasma display device K5, the exhaust fan may also be provided as an auxiliary for natural convection of air so as to promote flow of air in the casing 22. In this case, since the number of the installed exhaust fans can be reduced in comparison with prior art plasma display devices, the above described drawbacks of the prior art plasma display devices can be mitigated.

Figure 24:
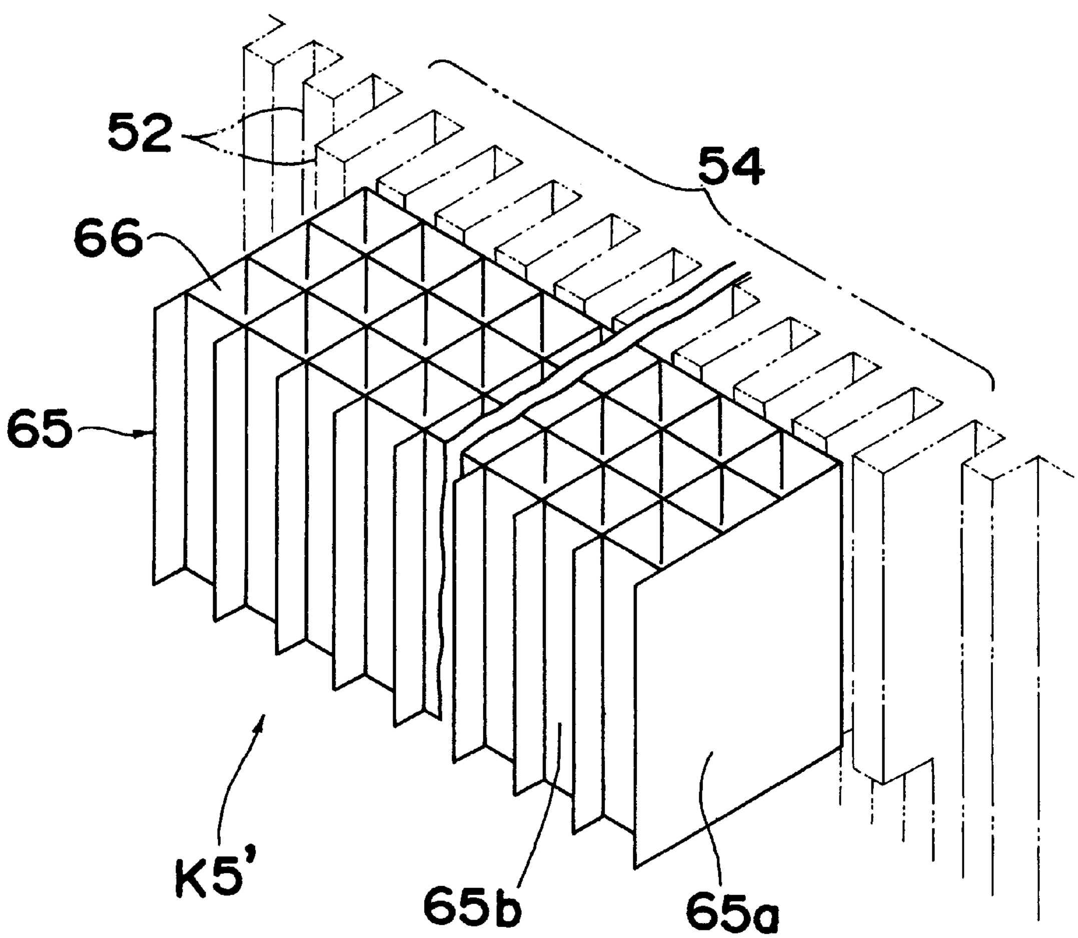
FIG. 24 is a fragmentary perspective of a plasma display device which is a modification of the plasma display device of FIG. 21.

FIG. 24 shows a plasma display device K5' which is a modification of the plasma display device K5. In the plasma display device K5', an auxiliary heat dissipating member 65 is additionally provided on the fins 52 at the upper central region 54 of the rear face 50 of the chassis member 38 so as to further raise heat dissipation efficiency of the fins 52 at the upper central region 54 of the chassis member 38. The auxiliary heat dissipating member 65 is formed by a metal plate 65*a* bent into a substantially U-shaped configuration and a metal plate assembly 65*b* having a checked pattern and fixed to an inside of the metal plate 65*a*. A plurality of square space regions 66 are defined in the auxiliary heat dissipating member 65 so as to extend vertically in the same manner as the fins 52. Each of the space regions 66 is not restricted to the square shape but may have any other shape. Experiments conducted by the inventors of this application showed that if the auxiliary heat dissipating member 65 is provided, the temperature of the chassis member 38 further drops 10° C. as compared with a case in which the auxiliary heat dissipating member 65 is not provided. Therefore, in the case of a plasma display device employing a DC type plasma display panel, in which the quantity of heat produced in the DC plasma display panel is larger than that of an AC type plasma display panel, it is especially preferable that the auxiliary heat dissipating member 65 is additionally provided.

Meanwhile, in FIG. 24, the auxiliary heat dissipating member 65 is provided on the fins 52 at the upper central region 54 of the rear face 50 of the chassis member 38. However, it may also be so arranged that the fins 52 at the upper central region 54 of the rear face 50 of the chassis member 38 are set to have a height identical with that of the fins 52 at the remaining region of the rear face 50 of the chassis member 38, namely, all the fins 52 on the rear face 50 of the chassis member 38 have an identical height and then, the auxiliary heat dissipating member 65 is provided on the fins 52 at the upper central region 54 of the chassis member 38 so as to raise heat dissipation efficiency of the fins 52 at the upper central region 54 of the rear face 50 of the chassis member 38.

As is clear from the foregoing description of the fifth embodiment of the present invention, heat transferred from the plasma display panel to the chassis member can be dissipated efficiently by the fins molded integrally with the chassis member. Air in the casing, which has been heated by this heat dissipation, is discharged outwardly from the vent holes of the upper portion of the casing and air having room temperature flows into the casing from the vent holes of the lower portion of the casing such that natural convection of air occurs. Consequently, the plasma display panel and the circuit boards are cooled and thus, the temperature in the casing can be maintained at not more than the permissible highest temperature.

Since the chassis member for supporting the plasma display panel acts also as a heat dissipating plate having high heat dissipation efficiency, the unforced cooling construction in which the interior of the casing is cooled by natural convection of air is employed, so that exhaust fans are not required. Therefore, such drawbacks as noise and failure of the exhaust fans and suction of dust due to forced exhaust can be obviated and production cost can be lowered. Meanwhile, since when the exhaust fan is used as an auxiliary for natural convection of air, the number of the installed exhaust fans can be reduced in comparison with prior art plasma display devices, the above mentioned disadvantages of the prior art plasma display devices can be eliminated and production cost can be reduced.

Figure 25:
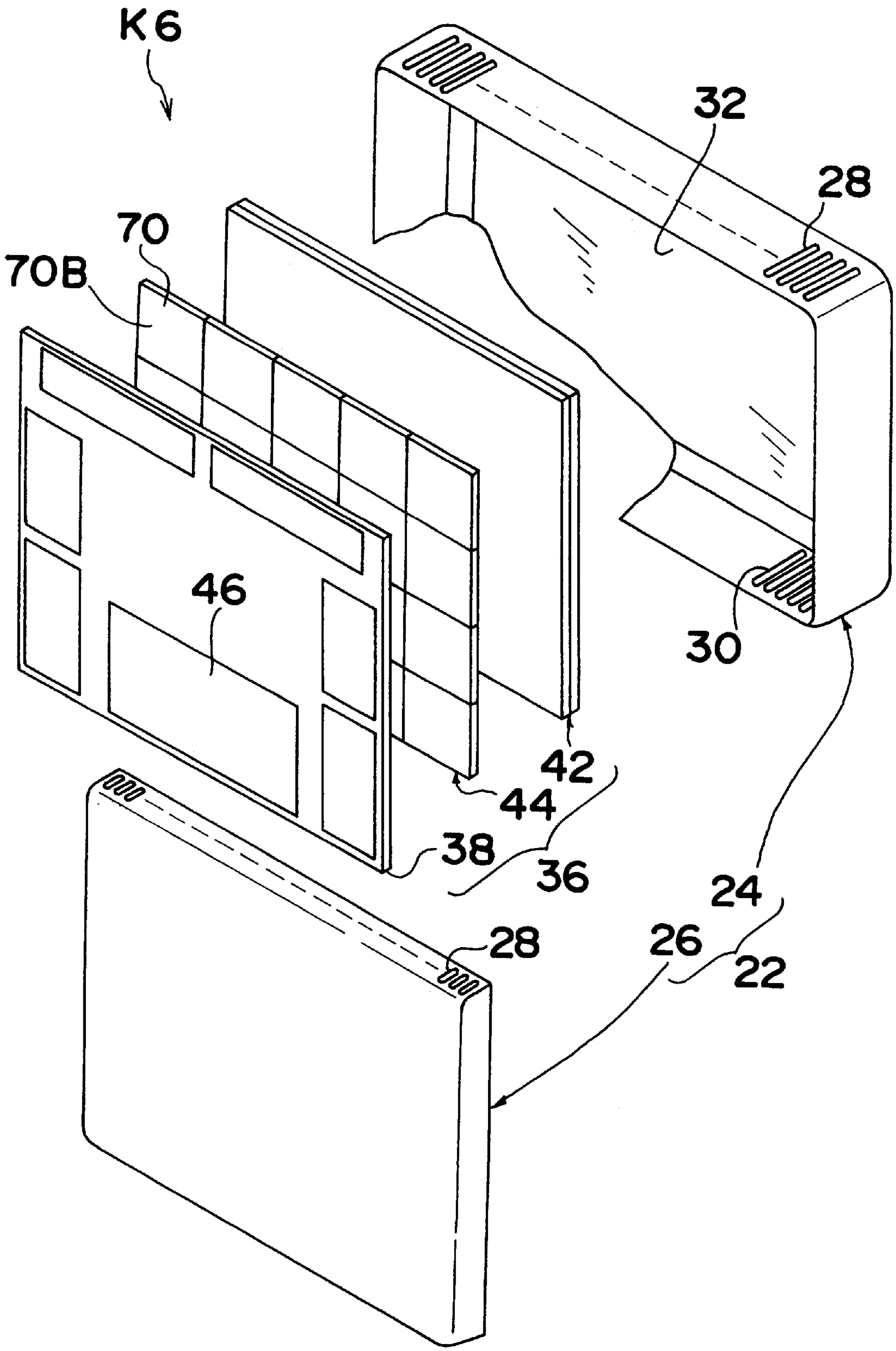
FIG. 25 is an exploded perspective view of a plasma display device according to a sixth embodiment of the present invention.

FIG. 25 shows a plasma display device K6 according to a sixth embodiment of the present invention. In the same manner as the plasma display device K5, the plasma display device K6 includes the casing 22 and the internal unit 36. The thermally conductive medium 44 of the internal unit 36 is formed by a sheet made of material having excellent thermal conductivity and flexibility, for example, silicone resin, and not only serves to efficiently transfer to the chassis member 38 heat produced in the plasma display panel 42 but acts also as a cushioning medium. As shown in FIG. 25, the thermally conductive medium 44 has a size substantially equal to that of the plasma display panel 42. Meanwhile, the thermally conductive medium 44 is formed by arranging a plurality of sheet pieces 70 in a checked pattern without any gap therebetween.

Figure 26:
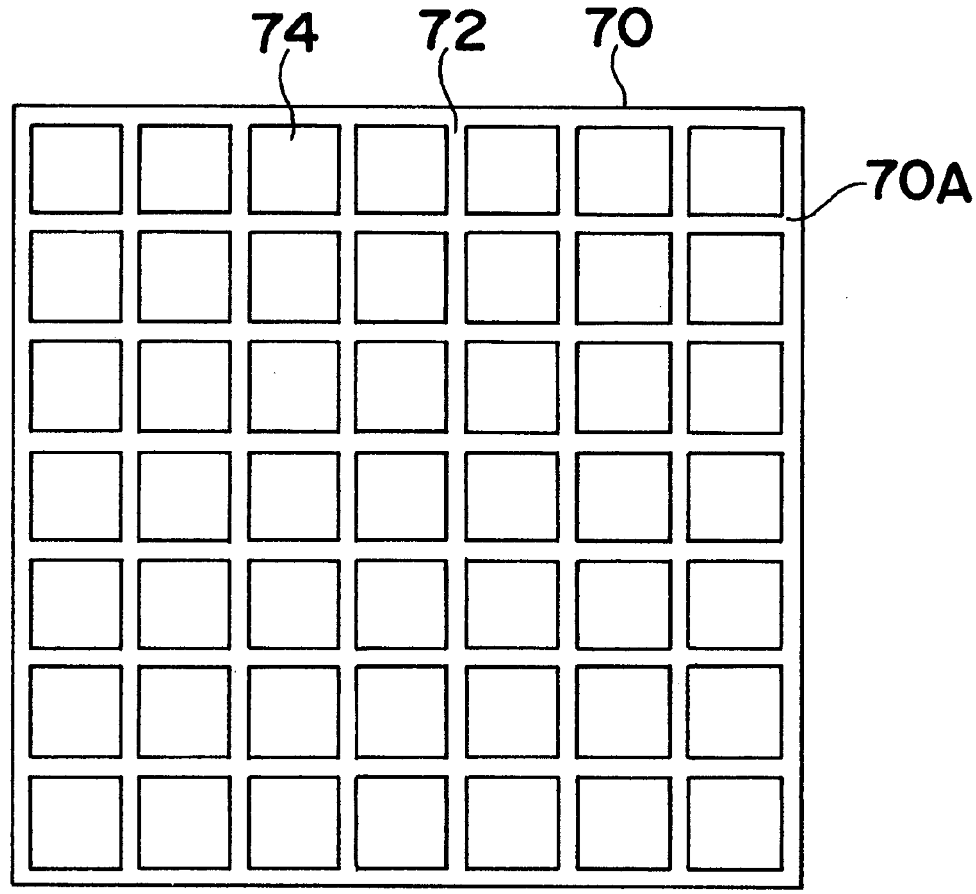
FIG. 26 is a top plan view of a sheet piece forming a thermally conductive sheet of the plasma display device of FIG. 25.
Figure 27:
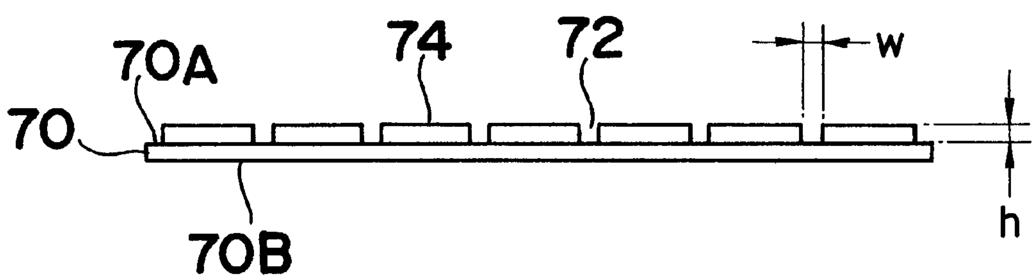
FIG. 27 is a side elevational view of the sheet piece of FIG. 26.

FIGS. 26 and 27 show the sheet piece 70 having opposite faces 70A and 70B confronting the plasma display panel 42 and the chassis member 38, respectively. A plurality of protrusions 74 are formed in a shape of a matrix on the face 70A of the sheet piece 70 such that a checked slit 72 is defined between the protrusions 74. The sheet piece 70 is of a square shape having a side of 100 mm in length and a thickness of 2 mm. The protrusion 74 is of a square shape having a side of 13 mm in length and a height h of 1 mm, while the slit 72 has a width w of 2 mm. However, these shapes and dimensions are not restrictive but may be changed variously.

Figure 28:
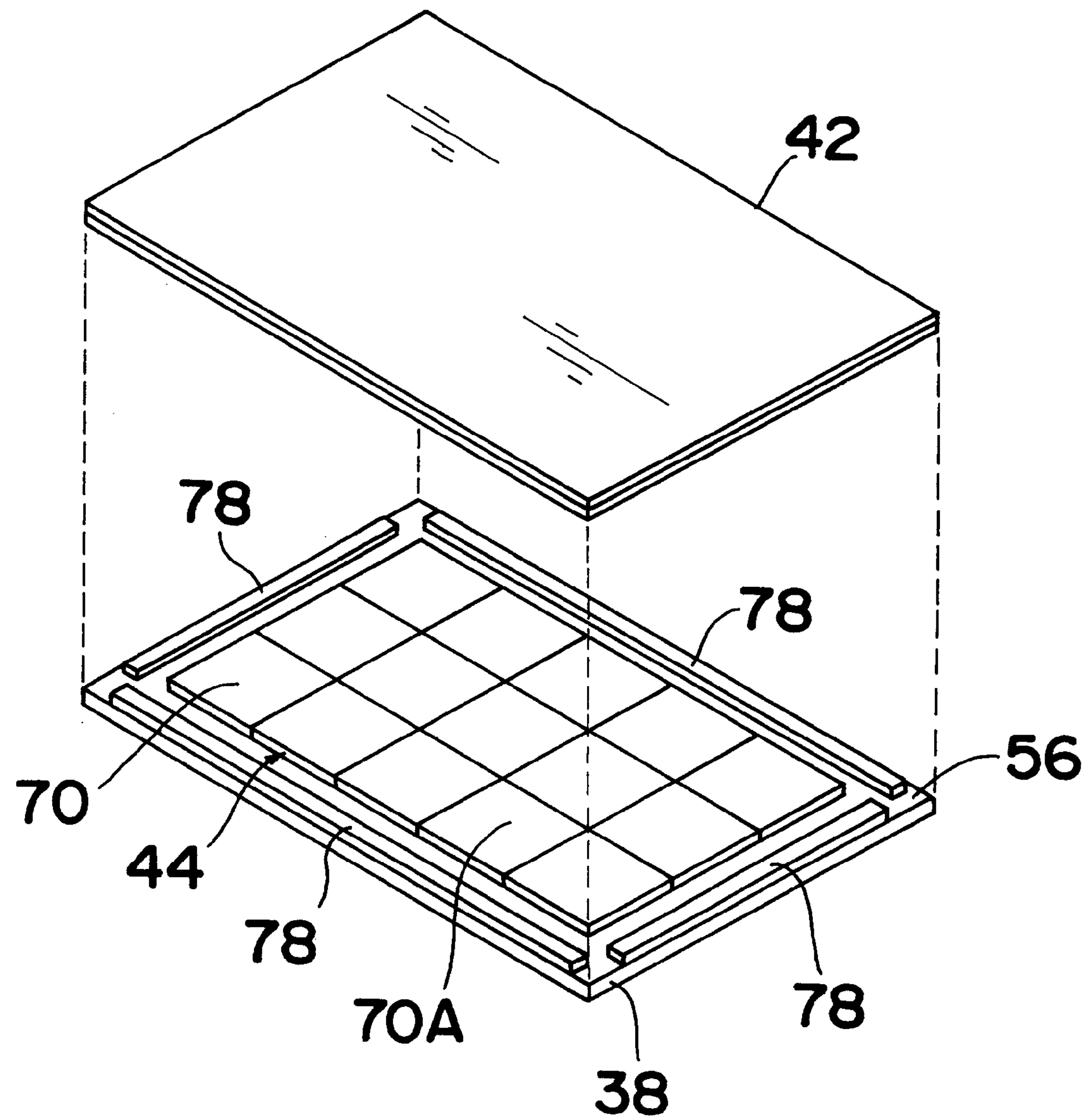
FIG. 28 is a view explanatory of a step for assembling a plasma display panel with a chassis member in the plasma display device of FIG. 25.

The plasma display panel 42 is assembled with the chassis member 38 as shown in FIG. 28. Initially, four double sided adhesive tapes 78 each having a thickness substantially equal to that of the thermally conductive medium 44 are bonded to four outer peripheral edges of the front face 56 of the chassis member 38, respectively. Then, the thermally conductive medium 44 formed by the arranged sheet pieces 70 is placed on the front face 56 of the chassis member 38 such that the face 70A of each of the sheet pieces 70, i.e., the protrusions 74 of each of the sheet pieces 70 confront the plasma display panel 42. Subsequently, air present between the chassis member 38 and the thermally conductive medium 44 is completely pushed out by using a roller or the like such that the thermally conductive medium 44 is brought into close contact with the chassis member 38. Since opposite faces of the thermally conductive medium 44 have stickiness, air does not penetrate in between the chassis member 38 and the thermally conductive medium 44 once the thermally conductive medium 44 has been brought into close contact with the chassis member 38.

Thereafter, the plasma display panel 42 is placed on the double sided adhesive tapes 78 and the thermally conductive medium 44 and is depressed lightly against the double sided adhesive tapes 78 from above with a hand. As a result, the plasma display panel 42 is brought into pressing contact with the protrusions 74 of each of the sheet pieces 70 of the thermally conductive medium 44, so that the square protrusions 74 are crushed so as to expand sidewise. The slit 72 of each of the sheet pieces 70 acts as an air discharge passage in the course of this expansion of the protrusions 74 so as to discharge air outwardly and is finally occupied by the expanding protrusions 74 so as to vanish. Consequently, any air layer between the thermally conductive medium 44 and the plasma display panel 42 is eliminated substantially completely, the thermally conductive medium 44 and the plasma display panel 42 are brought into close contact with each other and the plasma display panel 42 is secured to the chassis member 38 by the double sided adhesive tapes 78. Since the plasma display panel 42 is not transparent, it is impossible to observe the process of discharging the air. However, it was confirmed by an experiment that when a transparent glass plate is brought into pressing contact with the thermally conductive medium 44, the glass plate is brought into close contact with the thermally conductive medium 44 without formation of an air layer therebetween.

Meanwhile, even if an air layer remains in the slits 72 when the plasma display panel 42 has been depressed against the thermally conductive medium 44, the plasma display panel 42 as a whole can be brought into contact with the thermally conductive medium 44 substantially uniformly and thus, the air layer remains substantially uniformly between the thermally conductive medium 44 and the plasma display panel 42. Therefore, thermal conductivity is improved and made uniform over the whole area of the plasma display panel 42 in comparison with a case in which an air layer remains locally between the thermally conductive medium 44 and the plasma display panel 42.

In the plasma display device K6, the protrusions 74 and the slits 72 are provided on one face of the thermally conductive medium 44 and the plasma display panel 42 is placed on and depressed lightly against the face of the thermally conductive medium 44 so as to outwardly discharge air present between the thermally conductive medium 44 and the plasma display panel 42 as described above. Therefore, since the thermally conductive medium 44 and the plasma display panel 42 can be brought into close contact with each other easily, thermal conductivity can be made uniform over the whole area of the plasma display panel 42.

Figure 29:
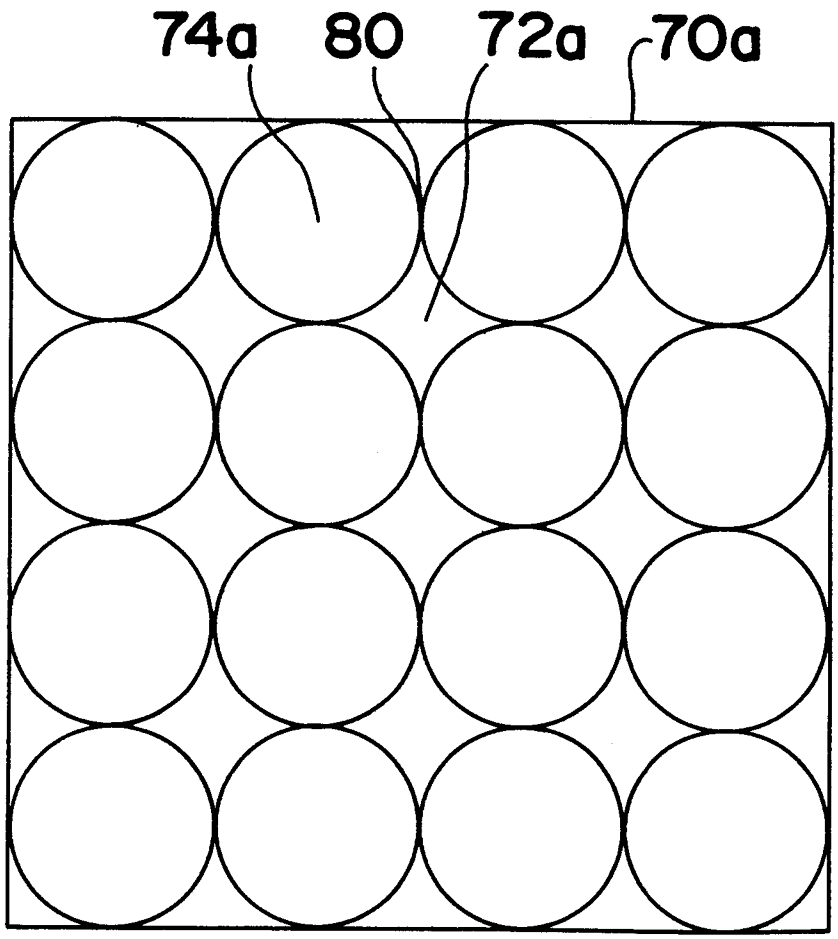
FIG. 29 is a top plan view of a sheet piece which is a modification of the sheet piece of FIG. 26.
Figure 30:
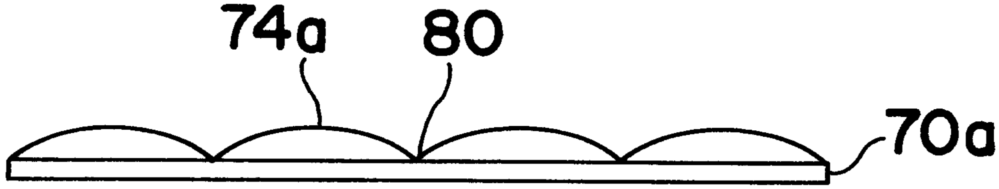
FIG. 30 is a side elevational view of the sheet piece of FIG. 29.

FIGS. 29 and 30 show a sheet piece 70_a_ which is a modification of the sheet piece 70 of FIG. 26. In the sheet piece 70_a_, a plurality of circular protrusions 74_a_ are arranged so as to be brought into contact with each other. As shown in FIG. 30, each of the protrusions 74_a_ has a convex surface such that its thickness decreases gradually from its central portion towards its outer periphery. Boundaries 80 between the protrusions 74_a_ and areas 72_a_ in which the protrusions 74_a_ are not present correspond to the slit 72 of the sheet piece 70. The sheet piece 70_a_ can achieve effects similar to those of the sheet piece 70.

Figure 31:
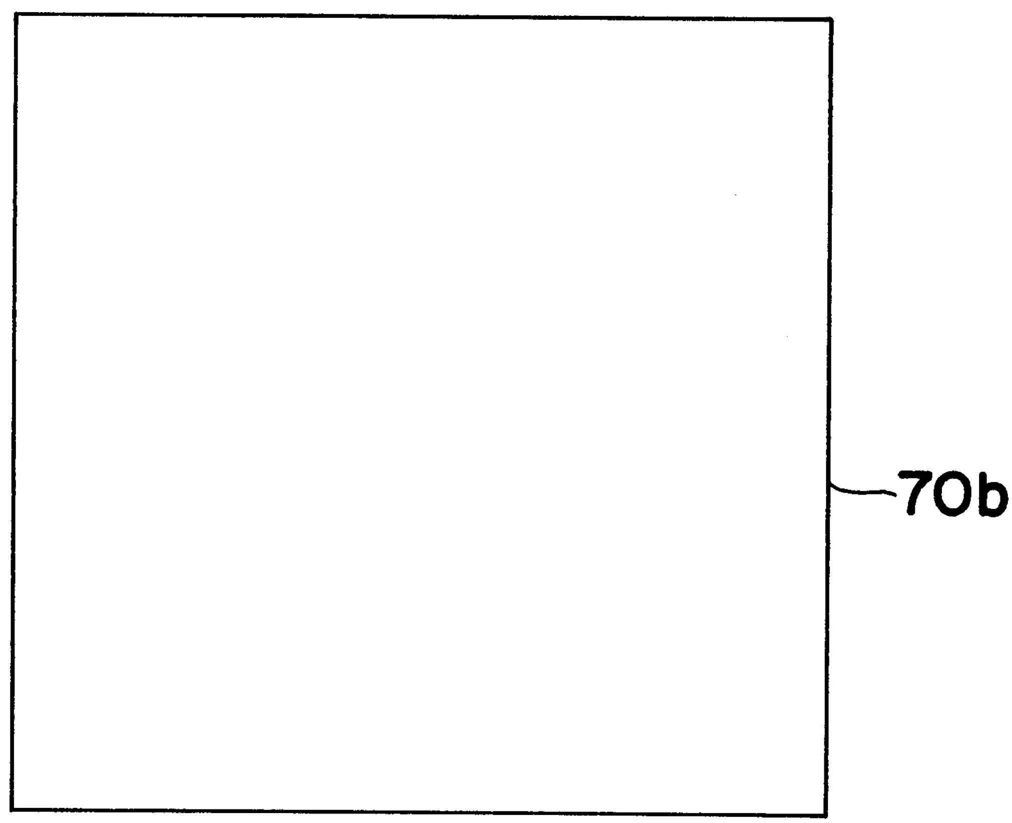
FIG. 31 is a top plan view of a sheet piece which is another modification of the sheet piece of FIG. 26.
Figure 32:
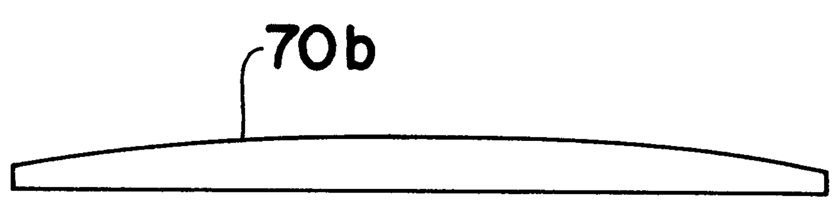
FIG. 32 is a side elevational view of the sheet piece of FIG. 31.

Meanwhile, FIGS. 31 and 32 show a sheet piece 70_b_ which is another modification of the sheet piece 70. The sheet piece 70_b_ has a convex surface such that its thickness decreases gradually from its central portion towards its outer periphery. Therefore, when the thermally conductive medium 44 is formed by arranging the sheet pieces 70_b_, the central portion of the sheet piece 70_b_ acts as the protrusions 74 of the sheet piece 70, while the outer periphery of the sheet piece 70_b_ acts as the slit 72 of the sheet piece 70. Accordingly, the thermally conductive medium 44 formed by the sheet pieces 70_b_ can gain effects similar to those of the thermally conductive medium 44 formed by the sheet pieces 70.

The protrusions 74 and the slits 72 are formed on one face of the thermally conductive medium 44 but may also be formed on opposite faces of the thermally conductive medium 44. Meanwhile, the thermally conductive medium 44 is formed by arranging a plurality of the sheet pieces 70, 70*a* or 70*b* but may also be formed by a single sheet of a size substantially equal to that of the plasma display panel 42 and having protrusions and a slit which produce effects of the protrusions 74 and the slit 72, respectively.

As is clear from the foregoing description of the sixth embodiment of the present invention, the protrusions and the slits are provided on one face of the thermally conductive medium and the plasma display panel is placed on the face of the thermally conductive medium and is depressed lightly against the face of the thermally conductive medium with a hand so as to outwardly discharge air present between the thermally conductive medium and the plasma display panel. Therefore, in the sixth embodiment of the present invention, since the plasma display panel and the thermally conductive medium can be easily brought into close contact with each other without a large quantity of air remaining between the plasma display panel and the thermally conductive medium, thermal conductivity can be made uniform over the whole area of the plasma display panel.

What is claimed is:

1. A plasma display device comprising:

a plasma display panel;

a chassis member which is disposed substantially in parallel with the plasma display panel; and a thermally conductive medium which is interposed between the plasma display panel and the chassis member.

2. A plasma display device as claimed in claim 1, wherein the thermally conductive medium is provided so as to be brought into substantially close contact with the plasma display panel and the chassis member.

3. A plasma display device as claimed in claim 2, wherein the thermally conductive medium has a two-layer construction having first and second mediums brought into substantially close contact with the display panel and the chassis member respectively, such that not only the first medium has a coefficient of thermal conductivity higher than that of the second medium but the second medium functions also as a cushioning medium.

4. A plasma display device as claimed in claim 1, wherein the thermally conductive medium is a thermally conductive sheet having first and second opposite faces; said first face is brought into contact with the plasma display panel; and a protrusion and a recess are provided on said first face of the thermally conductive sheet.

5. A plasma display device as claimed in claim 1, wherein the thermally conductive medium is a flexible thermally conductive sheet having first and second opposite faces, said first face is brought into contact with the plasma display panel, and a protrusion and a recess are provided on said first face of the thermally conductive sheet;

wherein when the plasma display panel is brought into pressing contact with the face of the thermally conductive sheet, the protrusion is crushed so as to expand sidewise;

wherein the recess acts as an air passage in the course of expansion of the protrusion so as to discharge air outwardly and is finally occupied by the expanding protrusion so as to vanish such that the plasma display panel and the thermally conductive sheet are brought into close contact with each other by substantially eliminating an air layer between the plasma display panel and the thermally conductive sheet.

6. A plasma display device as claimed in claim 1, wherein a circuit board for driving the plasma display panel is supported on one face of the chassis member remote from the plasma display panel and a plurality of heat dissipating fins are integrally molded on a substantially whole area of the face of the chassis member.

7. A plasma display device as claimed in claim 6, wherein the heat dissipating fins include first heat dissipating fins disposed at an upper region of the face of the chassis member and second heat dissipating fins disposed at the remaining region of the face of the chassis member and the first heat dissipating fins have a thermal conductivity larger than that of the second heat dissipating fins.

8. A plasma display device as claimed in claim 6, wherein the heat dissipating fins include first heat dissipating fins disposed at an upper region of the face of the chassis member and second heat dissipating fins disposed at the remaining region of the face of the chassis member, and the first heat dissipating fins project from the face of the chassis member a greater distance than the second heat dissipating fins.

9. A plasma display device as claimed in claim 7, wherein the circuit board is disposed around the first heat dissipating fins.

10. A plasma display device as claimed in claim 6, wherein an auxiliary heat dissipating member is provided on the heat dissipating fins.

11. A plasma display device as claimed in claim 6, wherein the plasma display panel, the thermally conductive medium and the chassis member are provided in a casing having a plurality of first vent holes formed at its upper portion and a plurality of second vent holes formed at its lower portion;

wherein air heated in the casing by heat dissipation from the plasma display panel, the circuit board and the chassis member is discharged out of the casing from the first vent holes by natural convection without using an exhaust fan and external air is introduced into the casing from the second vent holes such that an unforced cooling construction for maintaining temperature in the casing at not more than a permissible highest temperature is formulated.

12. A plasma display device as claimed in claim 1, further including a cushioning medium provided around a whole outer periphery of the thermally conductive medium.

13. A plasma display device as claimed in claim 1, wherein the thermally conductive medium is formed by a silicone sheet.

14. A plasma display device wherein a thermally conductive medium is provided so as to be brought into substantially close contact with a rear face of a plasma display panel.

15. A method of manufacturing a plasma display device, comprising:

providing a cushioning medium at an outer periphery of a chassis member;

injecting liquid of a thermally conductive medium into a region surrounded by the cushioning medium; solidifying the liquid of the thermally conductive medium; and attaching a plasma display panel to the thermally conductive medium.

16. A method of manufacturing a plasma display device, comprising the:

providing a mold at an outer periphery of a chassis member;

injecting liquid of a thermally conductive medium into a region surrounded by the mold;

solidifying the liquid of the thermally conductive medium; and attaching a plasma display panel to the thermally conductive medium.

* * * * *

UNITED STATES PATENT AND TRADEMARK OFFICE

CERTIFICATE OF CORRECTION

PATENT NO. : 5,971,566

DATED : October 26, 1999

INVENTOR(S) : Yutaka Tani et al

It is certified that error appears in the above-identified patent and that said Letters Patent is hereby corrected as shown below:

On the title page: Item [73] Assignee: should read -- Matsushita Electronics Corporation, Osaka, Japan --.

Signed and Sealed this

Twelfth Day of September, 2000

Attest:

Q. TODD DICKINSON

*Attesting Officer*

*Director of Patents and Trademarks*

US005971566C1

(12) EX PARTE REEXAMINATION CERTIFICATE (5644th)

United States Patent

Tani et al.

(10) Number: US 5,971,566 C1

(45) Certificate Issued: Jan. 2, 2007

(54) PLASMA DISPLAY DEVICE AND ITS MANUFACTURING METHOD

(75) Inventors: Yutaka Tani, Sanda (JP); Shigeo Hirano, Otsu (JP)

(73) Assignee: Matsushita Electric Industrial Co., Ltd., Kadoma (JP)

Reexamination Request:
No. 90/007,151, Jul. 30, 2004

Reexamination Certificate for:

| | |
|---|---|
| Patent No.: | **5,971,566** |
| Issued: | **Oct. 26, 1999** |
| Appl. No.: | **08/893,986** |
| Filed: | **Jul. 16, 1997** |

Certificate of Correction issued Sep. 12, 2000.

(30) Foreign Application Priority Data

| | | |
|---|---|---|
| Jul. 23, 1996 | (JP) | 8-193204 |
| Dec. 16, 1996 | (JP) | 8-335334 |
| Dec. 24, 1996 | (JP) | 8-343173 |
| Mar. 14, 1997 | (JP) | 9-061076 |

(51) Int. Cl.
*F21V 29/00* (2006.01)

(52) U.S. Cl. .......................................... 362/294; 313/46

(58) Field of Classification Search ................. 362/294, 362/373; 313/46, 493, 573, 582, 634; 165/80.3, 165/185; 361/704, 706, 707, 708, 709, 710
See application file for complete search history.

(56) References Cited

U.S. PATENT DOCUMENTS

| | | | | |
|---|---|---|---|---|
| 5,014,777 A | * | 5/1991 | Sano | 165/185 |
| 5,060,114 A | * | 10/1991 | Feinberg et al. | 165/185 |
| 5,583,529 A | | 12/1996 | Satou | 345/87 |

FOREIGN PATENT DOCUMENTS

| | | | |
|---|---|---|---|
| EP | 0 425 793 | | 5/1991 |
| JP | 2-166755 | | 6/1990 |
| JP | 2-121782 | | 10/1990 |
| JP | 404012557 A | * | 1/1992 |
| JP | 5-235218 | | 9/1993 |
| JP | 409055459 A | * | 2/1997 |

OTHER PUBLICATIONS

Matsushita Electric Industrial Co., Ltd., "National Technical Report", vol. 24, No. 3, Jun. 1996 and a partial translation.

* cited by examiner

*Primary Examiner*—Minh Nguyen

(57) ABSTRACT

A plasma display device comprising a plasma display panel, a chassis member which is disposed substantially in parallel with the plasma display panel, and a thermally conductive medium which is interposed between the plasma display panel and the chassis member.

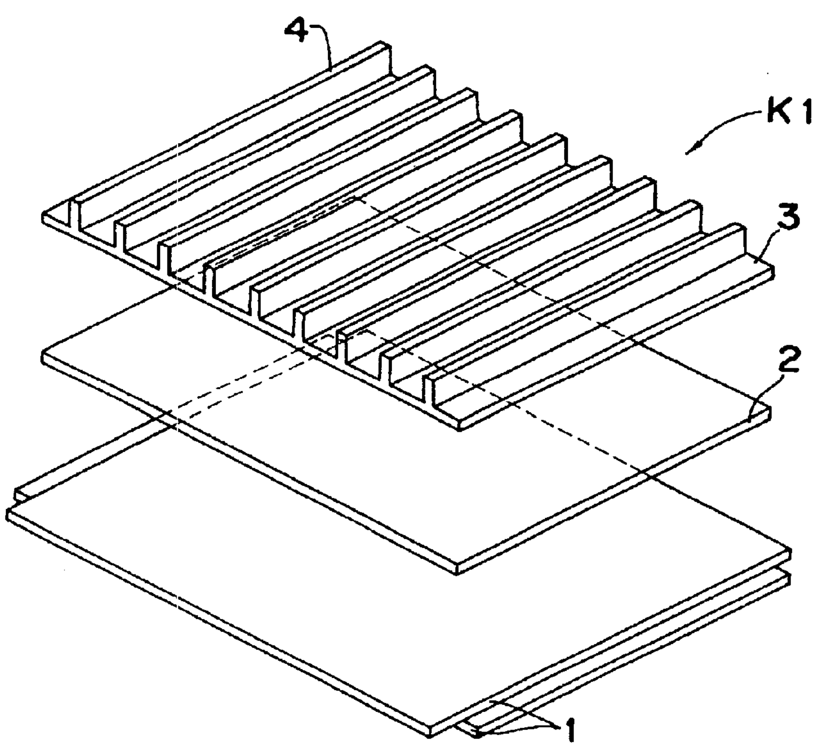

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 15–16 is confirmed.

Claims 12–14 are cancelled.

Claims 1–8 and 11 are determined to be patentable as amended.

Claims 9 and 10, dependent on an amended claim, are determined to be patentable.

New claims 17–24 are added and determined to be patentable.

1. A plasma display device comprising:

*an internal unit including a chassis member and* a plasma display panel *mounted on a front face of the chassis member*;

[a chassis member which is disposed substantially in parallel with the plasma display panel; and]

a thermally conductive medium which is interposed between [the plasma display panel and] the chassis member *and the plasma display panel so as to be brought into close contact with the plasma display panel;*

*a circuit board for driving light emission of the plasma display panel, which is provided on a rear face of the chassis member; and*

*a casing for accommodating the internal unit, the casing comprising a front casing and a rear casing, the rear casing being formed with a plurality of vent holes.*

2. A plasma display device as claimed in claim 1, wherein the thermally conductive medium is [provided so as to be brought into substantially close contact with the plasma display panel and the chassis member] *formed by a sheet having a thickness of 1 mm to 5 mm.*

3. A plasma display device as claimed in claim [2] *1*, wherein the thermally conductive medium [has] *is of* a two-layer construction having first and second mediums *such that the first medium is* brought into [substantially] close contact with the [display panel and the chassis member respectively, such that not only] *plasma display panel, and*

*wherein* the first medium has a coefficient of thermal conductivity higher than that of the second medium [but] *and* the second medium [functions also as a cushioning medium] *is made of an elastic material.*

4. A plasma display device as claimed in claim 1, wherein the thermally conductive medium is [a thermally conductive sheet having first and second opposite faces; said first face is brought into contact with the plasma display panel; and a protrusion and a recess are provided on said first face of the thermally conductive sheet] *formed by a sheet having a thickness of 0.1 mm to 0.5 mm.*

5. A plasma display device as claimed in claim 1, wherein the thermally conductive medium is [a flexible thermally conductive sheet having first and second opposite faces, said first face is brought into contact with the plasma display panel, and a protrusion and a recess are provided on said first face of the thermally conductive sheet;

wherein when the plasma display panel is brought into pressing contact with the face of the thermally conductive sheet, the protusion is crushed so as to expand sidewise;

wherein the recess acts as an air passage in the course of expansion of the protrusion so as to discharge air outwardly and is finally occupied by the expanding protrusion so as to vanish such that the plasma display panel and the thermally conductive sheet are brought into close contact with each other by substantially eliminating an air layer between the plasma display panel and the thermally conductive sheet] *divided into a plurality of pieces.*

6. A plasma display device as claimed in claim 1, wherein [a] *the* circuit board for driving *the light emission of* the plasma display panel is supported on [one] *the rear* face of the chassis member *which is* remote from the plasma display panel and a plurality of heat dissipating fins are integrally molded on a substantially whole area of the *rear* face of the chassis member.

7. A plasma display device as claimed in claim 6, wherein the heat dissipating fins include first heat dissipating fins disposed at an upper region of the *rear* face of the chassis member and second heat dissipating fins disposed at the remaining region of the *rear* face of the chassis member and the first heat dissipating fins have a thermal conductivity larger than that of the second heat dissipating fins.

8. A plasma display device as claimed in claim 6, wherein the heat dissipating fins include first heat dissipating fins disposed at an upper region of the *rear* face of the chassis member and second heat dissipating fins disposed at the remaining region of the *rear* face of the chassis member, and the first heat dissipating fins project from the *rear* face of the chassis member a greater distance than the second heat dissipating fins.

11. A plasma display device as claimed in claim 6, wherein the plasma display panel, the thermally conductive medium and the chassis member are provided in [a casing] *the casing, the front and rear casings* having a plurality of first vent holes formed at [its] *their* upper [portion] *portions* and a plurality of second vent holes formed at [its] *their* lower [portion] *portions*;

wherein air heated in the casing by heat dissipation from the plasma display panel, the circuit board and the chassis member is discharged out of the casing from the first vent holes by natural convection without using an exhaust fan and external air is introduced into the casing from the second vent holes such that an unforced cooling construction for maintaining temperature in the casing at not more than a permissible highest temperature is formulated.

*17. A plasma display device comprising:*

*a plasma display panel;*

*a chassis member having a front face, the plasma display panel being mounted on the front face;*

*a thermally conductive medium which is interposed between the chassis member and the plasma display panel so as to be brought into close contact with the plasma display panel; and*

*a double sided adhesive tape which is provided on the front face of the chassis member so as to bond the chassis member and the plasma display panel to each other at an outer peripheral portion of the plasma dislay panel.*

*18. A plasma display device as claimed in claim 17, wherein the thermally conductive medium is formed by a sheet having a thickness of 1 mm to 5 mm.*

*19. A plasma display device as claimed in claim 17, wherein the thermally conductive medium is of a two-layer construction having first and second mediums such that the first medium is brought into close contact with the plasma display panel, and*

*wherein the first medium has a coefficient of thermal conductivity higher than that of the second medium and the second medium is made of an elastic material.*

*20. A plasma display device as claimed in claim 17, wherein the thermally conductive medium is formed by a sheet having a thickness of 0.1 mm to 0.5 mm.*

*21. A plasma display device as claimed in claim 17, wherein the thermally conductive medium is divided into a plurality of pieces.*

*22. A plasma display device comprising:*

*a plasma display panel;*

*a chassis member having a front face, the plasma display panel being mounted on the front face; and*

*a thermally conductive medium which is interposed between the chassis member and the plasma display panel so as to be brought into close contact with the plasma display panel and is made of an elastic material,*

*wherein the thermally conductive medium is formed by a sheet having a thickness of 1 mm to 5 mm.*

*23. A plasma display device as claimed in claim 22, wherein the thermally conductive medium is of a two-layer construction having first and second mediums such that the first medium is brought into close contact with the plasma display panel, and*

*wherein the first medium has a coefficient of thermal conductivity higher than that of the second medium and the second medium is made of an elastic material.*

*24. A plasma display device as claimed in claim 22, wherein the thermally conductive medium is divided into a plurality of pieces.*

* * * * *